Figure 1:
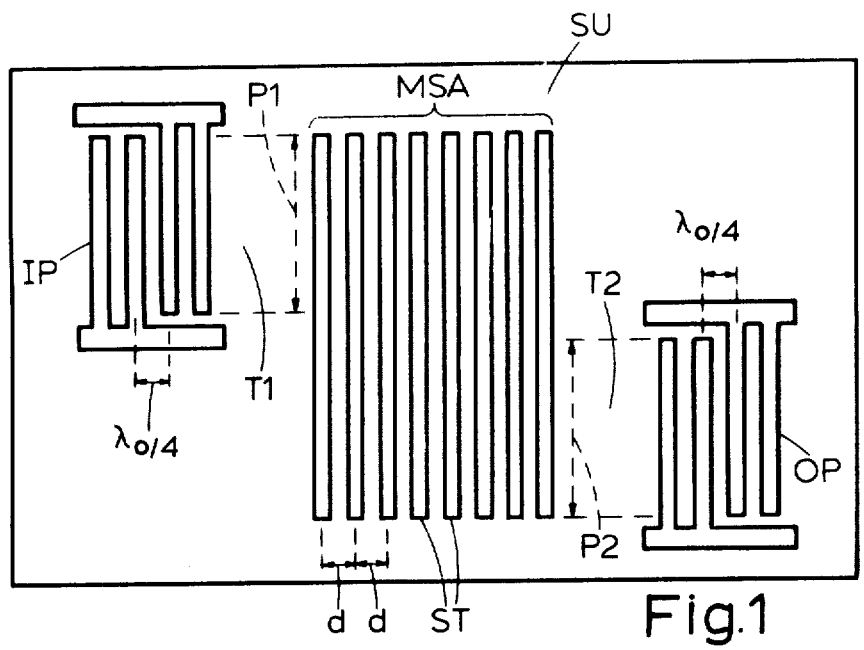

United States Patent [19]

Schofield

[11] 4,370,633

[45] Jan. 25, 1983

[54] ACOUSTIC WAVE BANDPASS ELECTRICAL FILTERS

[75] Inventor: John Schofield, Coulsdon, England

[73] Assignee: U.S. Philips Corporation, New York, N.Y.

[21] Appl. No.: 236,357

[22] Filed: Feb. 20, 1981

[30] Foreign Application Priority Data

Jan. 19, 1981 [GB] United Kingdom ............... 8101527

[51] Int. Cl.³ .................. H03H 9/64; H03H 9/145
[52] U.S. Cl. .......................... 333/195; 310/313 D; 333/196
[58] Field of Search ........................ 333/150–155, 333/193–196; 310/313 R, 313 A, 313 B, 313 C, 313 D

[56] References Cited

U.S. PATENT DOCUMENTS 4,079,342 3/1978 Solie ..................... 333/196

Primary Examiner—Marvin L. Nussbaum

Attorney, Agent, or Firm—Robert T. Mayer; Bernard Franzblau

[57] ABSTRACT

A surface acoustic wave bandpass electrical filter consists of input and output interdigital transducers (IP, OP) with an interposed track changing multistrip array (MSA). A conventional broadband array (MSA) is divided into three sub-groups of strips with respect to a center of symmetry (C) separated by different distances along the input track (T1) and the output track (T2) such that the amplitude-frequency response of the array (MSA) has a stopband centered on a predetermined frequency. If the input and output transducers (IP, OP) both have a double electrode configuration, electrode separation $\lambda o/4$, providing a fundamental passband at a corresponding frequency $f_o$ and an equal amplitude passband at the third harmonic $3f_o$, then a separation difference of $\lambda o/6$ between the sub-groups of the array (MSA) in the two tracks (T1, T2) can suppress the third harmonic passband in the filter output.

8 Claims, 6 Drawing Figures

ACOUSTIC WAVE BANDPASS ELECTRICAL FILTERS

The present invention relates to acoustic wave bandpass electrical filters, and in particular to such devices including a track changing multistrip array arranged between input and output transducers on a substrate able to propagate acoustic waves at a surface thereof.

Surface acoustic wave (SAW) bandpass electrical filters are well known which consist of an input interdigital transducer and an output interdigital transducer with an interposed track changing multistrip array on a high coupling piezoelectric substrate, e.g. Y-Z lithium niobate. The combined amplitude-frequency response of the two transducers has a passband which is substantially the desired passband of the filter. The major advantage of the multistrip array in these filters is that it provides relative suppression of bulk wave spuriae, and a further advantage is that it allows apodization weighting of both transducers.

The amplitude-frequency response of each transducer in these filters has a fundamental passband and further passbands at particular harmonics dependent on the sampling configuration of the transducer, that is to say the centre-to-centre separation period and the mark-to-space ratio of the transducer electrodes. If the input and output transducers have different sampling configurations then this may result in suppression of certain of these harmonic passbands in the combined amplitude-frequency response of the filter. This suppression will not occur if the two transducers have the same sampling configuration. An interdigital transducer having electrodes with a centre-to-centre separation period of a quarter wavelength of surface acoustic waves at the centre frequency of the fundamental passband, known as a double or split electrode transducer, and with an electrode mark-to-space ratio of one-to-one has, as the nearest further passband to the fundamental passband, a third harmonic passband response which is of nearly equal amplitude to that of the fundamental passband. A major advantage of the double electrode configuration transducer is that interactions within the transducer which cause undesired ripples in the amplitude-frequency response are minimized, and for this reason it is common to use this configuration for both the input and output transducers. However, the unsuppressed third harmonic response resulting from this use can be a significant disadvantage in certain filter applications. An interdigital transducer having electrodes with a centre-to-centre separation period of a half wavelength of surface acoustic waves at the centre frequency of the fundamental passband, known as a single electrode transducer, and with an electrode mark-to-space ratio of one-to-one has, as the nearest further passband to the fundamental passband, a fifth harmonic passband response. An advantage of the single electrode configuration transducer is that for a given minimum realisable width of the electrodes the fundamental passband is at twice the frequency of a double electrode configuration transducer. However, the unsuppressed fifth harmonic response resulting from this use may be a significant disadvantage in certain filter applications.

An object of the invention is to overcome the above-mentioned disadvantages of unsuppressed harmonic responses.

According to the invention there is provided an acoustic wave bandpass electrical filter including a substrate able to propagate acoustic waves at a surface thereof, input transducing means arranged to launch acoustic wave energy along a first propagation track at said surface, output transducing means arranged to receive acoustic wave energy from a second propagation track at said surface, and electrical coupling means arranged to receive acoustic wave energy from the input transducing means in the first track and to relaunch at least part of that energy as acoustic wave energy towards the output transducing means in the second track, in which the combined amplitude frequency response of the input and output transducing means has a first passband which is substantially the desired passband of the filter and further passbands having a harmonic relationship with said first passband, and in which the coupling means consists of an array of conducting strips across the first track and an array of conducting strips across the second track, the conducting strips of each array being discrete parallel strips electrically insulated from each other with the strips of the two arrays being electrically connected in pairs with each pair consisting of one strip from each array, characterised in that the strips of the coupling means are arranged in at least one first group, the or each first group consisting of three sub-groups and each sub-group consisting of strips from both arrays, in that the three sub-groups of the or each first group are separated by different distances along the first and second tracks, and in that the composition of the three sub-groups of the or each first group and their separation along the first and second tracks are selected to provide a stopband in the amplitude-frequency response of the coupling means which suppresses a selected said further passband.

The sampling configuration of the transducers forming the input and output transducing means may be a wholly double electrode configuration such that said first passband is a fundamental passband and the nearest said further passband is a corresponding third harmonic passband, in which case the selected said further passband which is suppressed may be said third harmonic passband. Another possibility is that the sampling configuration of the transducers forming the input and output transducing means may be a wholly single electrode configuration such that said first passband is a fundamental passband and the nearest said further passband is a corresponding fifth harmonic passband, in which case the selected said further passband which is suppressed may be said fifth harmonic passband.

Surface acoustic wave bandpass electrical filters are known, for example from an article by L. P. Solie in Applied Physics Letters, Vol. 30, No. 8, 15 April 1977, in which the strips of a multistrip array are arranged in groups so as to provide a shaped passband amplitude-frequency response for the multistrip array. The invention, in providing at least one first group, is applicable to this type of device.

In devices according to the invention the acoustic waves which the substrate is able to propagate at a surface thereof may be conventional surface acoustic waves propagating in the surface of the substrate. The acoustic waves may otherwise be, for example, bulk acoustic waves propagating parallel and close to that surface of the substrate. The possible use of this type of bulk acoustic wave is mentioned in connection with delay line feedback oscillators in U.K. Patent Specification No. 1,451,326 and a range of rotated Y-cuts of quartz with propagation perpendicular to the X-axis suitable for this purpose is described in Electronics Letters, Mar. 3, 1977, Vol. 13, No. 5 at pages 128 to 130. The acoustic waves may also otherwise be, for example, piezoelectric leaky surface waves propagating along the X axis of a 41° or 64° rotated X-cut plane of lithium niobate as described in an article by K. Yamanouchi and K. Shibayama in Journal of Applied Physics, Vol. 43, No. 3, March 1972 at pages 856 to 862.

Figure 2:
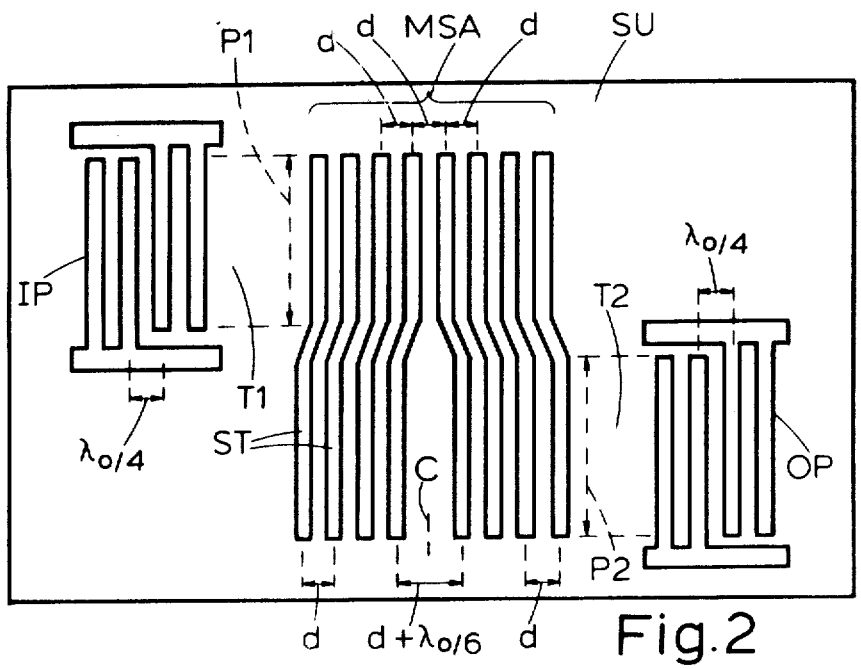
Figure 3:
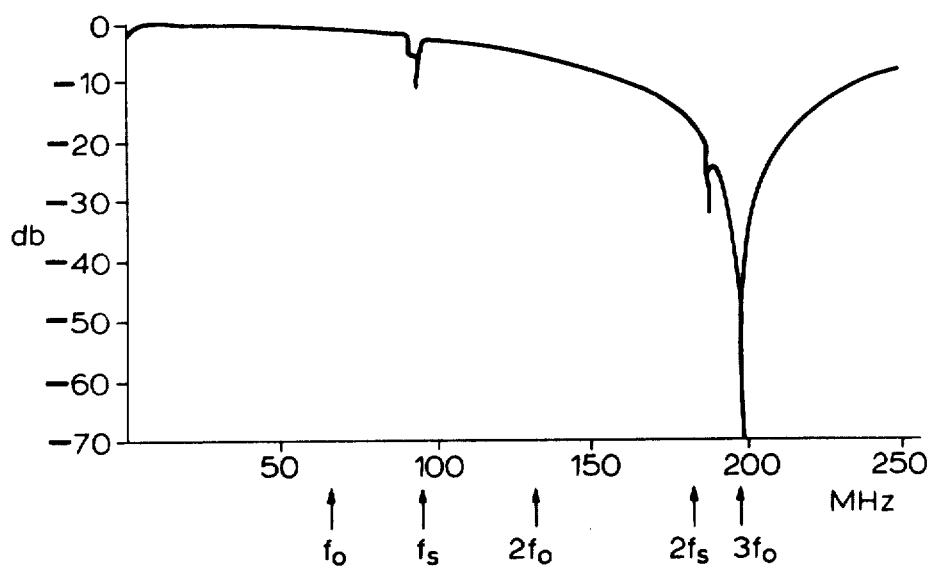
Figure 4:
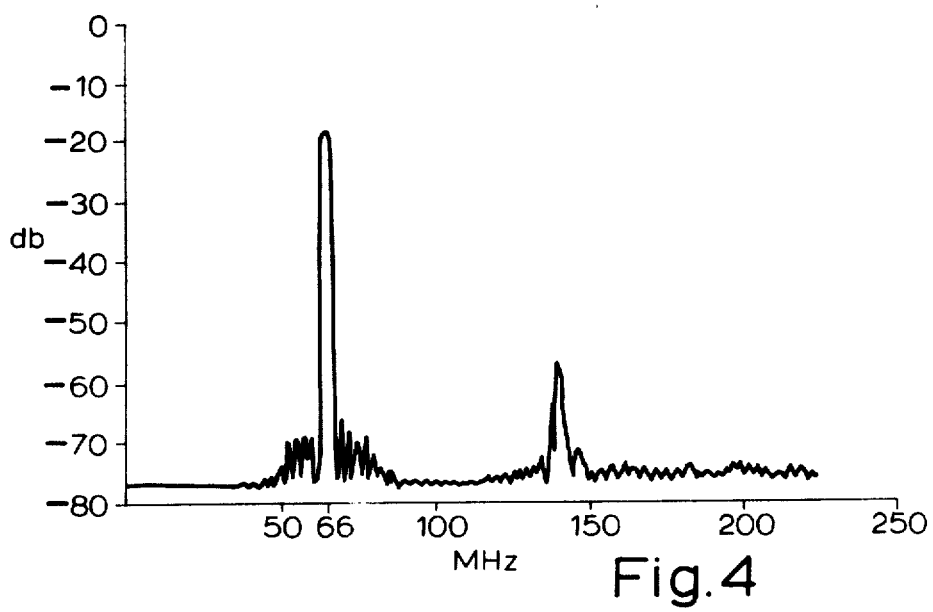
Figure 5:
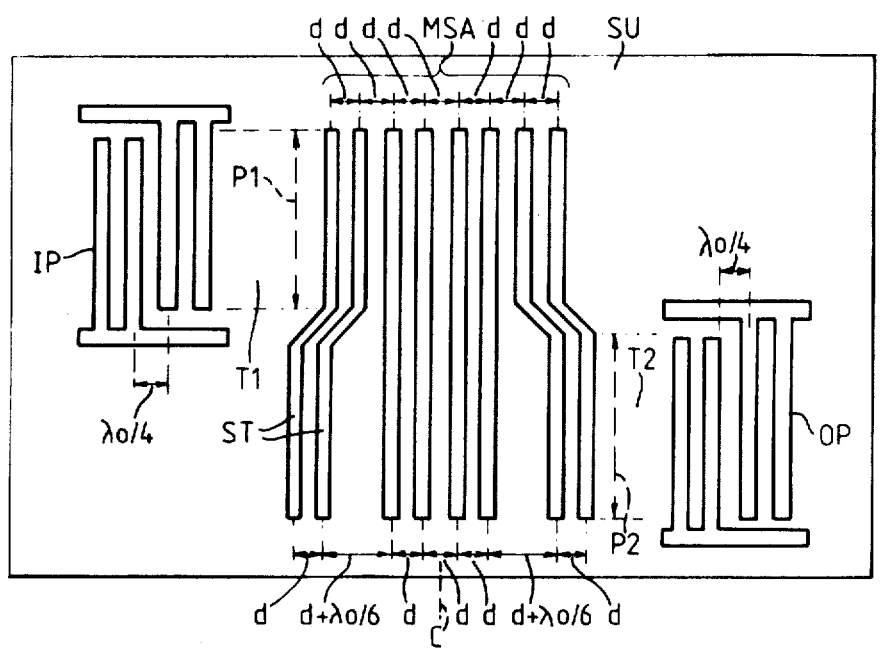
Figure 6:
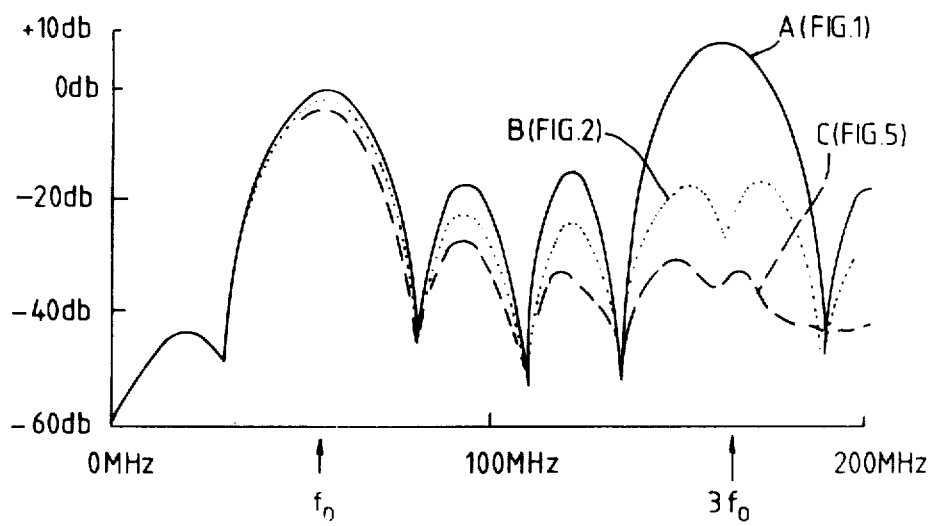

The invention will now be described in more detail with reference to the accompanying drawings, in which:

FIG. 1 shows schematically in plan view a known surface acoustic wave bandpass electrical filter incorporating double electrode input and output interdigital transducers with an interposed conventional track changing multistrip coupler, FIG. 2 shows the filter of FIG. 1 with a modified multistrip coupler for providing a stopband centred on a first frequency, FIG. 3 shows a predicted amplitude-frequency response of an example of a multistrip coupler as shown in FIG. 2, FIG. 4 shows the measured amplitude-frequency response of an example of a surface acoustic wave filter of the type shown in FIG. 2 and including the multistrip coupler whose response is shown in FIG. 3, FIG. 5 shows the filter of FIG. 1 with a modified multistrip coupler according to the invention for providing a stopband centred on a first frequency, and FIG. 6 shows three amplitude-frequency response curves comparing devices according to the configurations shown in FIGS. 1, 2, and 5.

Referring now to FIG. 1 there is shown a substrate SU able to propagate surface acoustic waves at a surface thereof, input transducing means IP arranged to launch surface acoustic wave energy along a first propagation track T1 at the surface, output transducing means OP arranged to receive surface acoustic wave energy from a second propagation track T2 at the surface and electrical coupling means MSA arranged to receive surface acoustic wave energy from the input transducing means IP in the first track T1 via an input port P1 and to relaunch at least part of that energy as surface acoustic wave energy towards the output transducing means OP in the second track T2 via an output port P2.

The input transducing means IP and the output transducing means OP are both interdigital transducers comprising double electrodes, that is to say having electrodes with a centre-to-centre separation period of a quarter wavelength $\lambda_0/4$ of surface acoustic waves at the centre frequency $f_0$ of a fundamental passband of the amplitude-frequency response of the transducer, and the mark-to-space ratio of the electrodes of the transducers is one-to-one. The combined amplitude-frequency response of the transducers IP and OP has harmonically repeated passbands of predetermined shape, including a fundamental passband centred at the frequency $f_0$ which is substantially the desired passband of the electrical filter formed by the device and a third harmonic passband at a frequency $3f_0$ which is of nearly equal amplitude to that of the fundamental passband.

The electrical coupling means MSA consists of an array of a number N of discrete parallel conducting strips ST electrically insulated from each other. Each strip ST may be considered as a pair of strips in which one strip of the pair is part of an array of strips across the track T1, the other strip of the pair is part of an array of strips across the track T2 and the two strips of each pair are electrically connected.

The array MSA is a conventional track changing multistrip coupler in that the centre-to-centre separation period d between the strips ST is constant for the array of strips in each of the tracks T1 and T2 and is the same in both tracks. The operation of the conventional multistrip coupler has been described in detail in, for example, an article by F. G. Marshall et al in IEEE Transactions 1973, MTT-21, pages 206 to 215. For the present purpose, its operation may be described simply as follows. Each strip ST may be considered as partially transferring the input signal from track T1 to track T2 with a constant phase shift. The total power transferred is a sine squared function of the number of strips N due to interactions within the coupler. The path length between the input port P1 and the output port P2 is constant for transfer via any strip ST. This means that the signals transferred by each strip ST add in phase over a very wide range of frequencies and hence the amplitude-frequency response of the conventional multistrip coupler is a very broad passband. This behaviour is modified in the immediate vicinity of the well known stopband frequency $f_s$ which is the frequency at which the strip period d is half a wavelength of surface acoustic waves and at harmonics of the frequency $f_s$. In general, when a conventional multistrip coupler is designed to track change a signal at a frequency $f_o$ (usually $f_o < f_s$) the coupler also transmits harmonics of $f_o$ (except in the region of the just-mentioned stopband harmonics). Thus in the known surface acoustic wave bandpass electrical filter shown in FIG. 1 the third harmonic passband at the frequency $3f_o$ is transmitted and input signals within that passband are present in the filter output.

Referring now to FIG. 2, there is shown the filter of FIG. 1 with a modified multistrip coupler. The group of N strips ST of the coupler MSA is now split with respect to a centre of symmetry C into two sub-groups each consisting of N/2 strips, and the two sub-groups are separated by different distances d and $(d + \lambda_0/6)$ along the tracks T1 and T2 respectively. Surface acoustic wave energy received by the coupler MSA via the input port P1 from the input transducer IP at the frequency $3f_o$ is relaunched at that frequency via the output port P2 with equal magnitude but in antiphase by the two sub-groups of the coupler MSA so that surface acoustic wave energy at the frequency $3f_o$ is not received by the output transducer OP.

An analysis technique for the investigation of the frequency response of a multistrip array is described in an article by M. Feldmann and J. Henaff in the Proceedings of the IEEE Ultrasonics Symposium 1977 at pages 686 to 690. This analysis has been applied to a multistrip array as shown in FIG. 2 in which the strip period d is $0.35\lambda_0$ with a mark-to-space ratio one-to-one, the total number of strips N is 108 and the assumed piezoelectric coupling constant $k^2$ is 0.047 (for a Y-Z lithium niobate substrate). The predicted amplitude-frequency transmission response of this multistrip array is shown in FIG. 3 which is scaled for $f_o = 66$ MHz. A stopband in the response centred on the frequency $3f_o$ is apparent. In the case shown where $3f_o$ is 198 MHz the response is $-30$ db over a bandwidth of 8 MHz centred on 198 MHz. The suppression centred on $3f_o$ is achieved at the expense of a small transmission loss at $f_o$ of 1.25 db. The stopbands at $f_s = 1.43f_o$ and at $2f_s$ are also in evidence.

A surface acoustic wave filter of the type shown in FIG. 2, that is to say having double electrode input and output transducers with a fundamental frequency $f_o=66$ MHz and a multistrip array as described in the previous paragraph on Y-Z lithium niobate has been made and the practical untuned frequency response of this filter measured with a 50 ohm source and load imedpances is shown in FIG. 4. The combined amplitude-frequency response of the input and output transducers has harmonically repeated passbands including a fundamental passband at $f_o$ (the bandwidth being 5 MHz centred on 66 MHz at 30 db down from the peak of the passband) and a corresponding passband of nearly equal amplitude at $3f_o$. The filter response shown in FIG. 4 shows that the passband response at $3f_o$ (198 MHz) has been completely suppressed. The response seen at 140 MHz is due to residual bulk waves.

Referring back to FIG. 2 the difference $\lambda o/6$ in the separation between the two sub-groups of the multistrip array along the tracks T1 and T2 respectively may be expressed as $\lambda o/2n$ where $n=3$. A signal input at the input port P1 of the array results in two output signals at the output port P2 which have a relative phase difference $\phi°$ at a frequency f defined by the equation $\phi=180 f/nf_o$ degrees. Thus at a frequency $f=nf_o$ the two signals have a phase difference of 180° and interfere destructively. Where $n=3$, a signal input at a frequency $3f_o$ will be suppressed; where n is another integer a corresponding other nth harmonic of the frequency $f_o$ will be suppressed. If n is not an integral number another frequency which is not a harmonic of $f_o$ may be chosen for suppression. Furthermore whatever value is chosen for n there will also be suppression at odd harmonics of the frequency $nf_o$, for example where $n=3$ there will be suppression at $3f_o$, $9f_o$, $15f_o$, $21f_o$ etc.

Referring now to FIG. 5, there is shown the filter of FIG. 1 with a modified multistrip coupler according to the invention. The group of N strips ST of the coupler MSA is now split with respect to a centre of symmetry C into three sub-groups with a centre sub-group consisting of N/2 strips and two outer sub-groups each consisting of N/4 strips, and the three sub-groups are separated by different distances d and $(d+\lambda o/6)$ along the tracks T1 and T2 respectively. Surface acoustic wave energy received by the coupler MSA via the input port P1 from the input transducer IP at the frequency $3f_o$ is relaunched at that frequency via the output port P2 by the two outer sub-groups with a combined magnitude equal to but in antiphase with the energy from the centre sub-group of the coupler MSA so that surface acoustic wave energy at the frequency $3f_o$ is not received by the output transducer OP. Both the width and in practice the depth of the stopband in the amplitude-frequency response of the coupler MSA centred on the frequency $3f_o$ are greater than that for the corresponding stopband of the multistrip array shown in FIG. 2, although this improvement is at the expense of a small additional transmission loss at $f_o$.

Referring now to FIG. 6 there are shown three measured amplitude-frequency response curves. The full line curve A shows the response of a device having the configuration shown in FIG. 1, the dotted line curve B shows the response of a device having the configuration shown in FIG. 2 and the dashed line curve C shows the response of a device having the configuration shown in FIG. 5. The three devices were all made on a rotated Y-cut X-propagating lithium niobate substrate so that the 3rd harmonic response of the transducers would not be obscured by bulk waves. The input and output transducers IP and OP were the same in all three devices, that is to say double electrode transducers with a fundamental frequency $f_o=55$ MHz and a wide fundamental passband of 50 MHz (null-to-null) so that the suppression properties of the multistrip coupler MSA is demonstrated within the equally wide third harmonic passband. In a practical filter the transducers would be such that the fundamental and third harmonic passbands are very much narrower, for example 10 MHz (null-to-null). The multistrip coupler consists of one hundred strips in all three devices. Curve A shows that the third harmonic response in the configuration of FIG. 1 is 10 db above the fundamental response which is due to better matching to the 50 ohm source and load impedances. Curves B and C show the above discussed small loss at the fundamental frequency $f_o$ and the stopband suppression around the third harmonic frequency $3f_o$ which is deeper and wider for the FIG. 5 configuration than for the FIG. 2 configuration.

The configuration shown in FIG. 1 is prior art. The configuration shown in FIG. 2, and as illustrated with reference to FIGS. 3 and 4, is the subject of U.K. published Patent Application No. 2,070,379A (inventors R. J. Murray and R. F. Mitchell) and is not part of the present invention claimed herein.

Possible variations within the scope of the invention are as follows.

If the interdigital transducers IP and OP shown in FIG. 5 have electrodes with a centre-to-centre separation period of a half wavelength $\lambda o/2$ of surface acoustic waves at the centre frequency $f_o$ of the fundamental passband, known as a single electrode transducer, and have an electrode mark-to-space ratio of one-to-one; then the nearest further passband to the fundamental passband is a fifth harmonic passband response at a frequency $5f_o$. An advantage of the single electrode configuration transducer is that for a given minimum realisable width of the electrodes the fundamental passband is at twice the frequency of a double electrode configuration transducer. However, the unsuppressed fifth harmonic response resulting from this use may be a significant disadvantage in certain filter applications. The composition and separation of the sub-groups of strips of the multistrip coupler MSA may then be chosen to provide a stopband in the amplitude-frequency response of the coupler centred on the frequency $5f_o$. In the configuration shown in FIG. 5 this may be achieved by the difference in the separation between the sub-groups along the tracks T1 and T2 being $\lambda o/10$.

The composition and separation of the three sub-groups of the coupler MSA may be varied. For example, if the three sub-groups have an equal number of strips and are separated by different distances d and $(d+\lambda o/9)$ along the tracks T1 and T2 respectively there will again be a stopband in the amplitude-frequency response of the coupler MSA centred on the third harmonic frequency $3f_o$, and the depth and width of this stopband will be between those of the stopbands at $3f_o$ of the couplers MSA shown in FIGS. 2 and 5.

In the above description filters have been discussed in which a stopband in the amplitude-frequency response of the multistrip coupler MSA suppresses an undesired odd harmonic passband in the combined amplitude-frequency response of the input and output transducers which has a desired fundamental frequency passband. The desired passband may be other than the fundamental frequency passband. Thus in more general terms in accordance with the invention, the combined amplitude-frequency response of the input and output transducers has a first passband which is substantially the desired passband of the filter and further passbands having a harmonic relationship with said first passband, and a stopband is provided in the amplitude-frequency response of the multistrip coupler which suppresses a selected said further passband.

The above-mentioned article by M. Feldmann and J. Henaff in the Proceedings of the IEEE Ultrasonics Symposium 1977 at pages 686 to 690 mentions two types of multistrip array, that is to say a transmitting array (MTA) and a reflecting array (MRA). The geometry of multistrip reflecting arrays is not suitable for adaptation within the scope of the present invention.

I claim:

1. In an acoustic wave bandpass electrical filter including a substrate able to propagate acoustic waves at a surface thereof, input transducing means arranged to launch acoustic wave energy along a first propagation track at said surface, output transducing means arranged to receive acoustic wave energy from a second propagation track at said surface, and electrical coupling means arranged on said surface so as to receive acoustic wave energy from the input transducing means in the first track and to relaunch at least part of that energy as acoustic wave energy towards the output transducing means in the second track, in which the combined amplitude-frequency response of the input and output transducing means has a first frequency passband which is substantially the desired passband of the filter and further frequency passbands having a harmonic relationship to said first passband, said coupling means comprising an array of conducting strips across the first track and an array of conducting strips across the second track, the conducting strips of each array being discrete parallel strips electrically insulated from each other and strips of the two arrays being electrically connected in pairs with each pair including one strip from each array, the improvement wherein the strips of the coupling means are arranged in at least one first group, the first group comprising three sub-groups and each sub-group comprising strips from both arrays, the sub-group spacing in the first track being different from the sub-group spacing in the second track, and the composition of the three sub-groups of the first group and their separation along the first and second tracks being selected to provide a stopband in the amplitude-frequency response of the coupling means which suppresses a selected said further passband.

2. A filter as claimed in claim 1, wherein said first passband is a fundamental frequency passband and the said further passband is a corresponding third harmonic passband, and in which the selected said further passband which is suppressed is said third harmonic passband.

3. A filter as claimed in claim 1 or claim 2, wherein said first passband is a fundamental frequency passband and the said further passband is a corresponding fifth harmonic passband, and in which the selected said further passband which is suppressed is said fifth harmonic passband.

4. A filter as claimed in claim 1 wherein the three sub-groups in one of said tracks are spaced apart by a distance d and the three sub-groups in the other of said first and second tracks are spaced apart by a distance $d + \lambda_o/2n$, where $\lambda_o$ is the wavelength of the center frequency $f_o$ of the desired passband and n is an odd integer greater than 1.

5. A filter as claimed in claim 1 wherein the three sub-groups in one of said tracks are spaced apart by a distance d and the three sub-groups in the other of said first and second tracks are spaced apart by a distance $d + \lambda_o/6$, where said first passband is a fundamental frequency passband and $\lambda_o$ is the wavelength of the center frequency $f_o$ of the first passband and said further passband which is suppressed is the third harmonic passband centered about $3f_o$.

6. A filter as claimed in claim 1 wherein the three sub-groups in one of said tracks are spaced apart by a distance d and the three sub-groups in the other of said first and second tracks are spaced apart by a distance $d + \lambda_o/10$, where said first passband is a fundamental frequency passband and $\lambda_o$ is the wavelength of the center frequency $f_o$ of the first passband and said further passband which is suppressed is the fifth harmonic passband centered about $5f_o$.

7. A filter as claimed in claim 1 wherein the total number of connecting strips of the first group is N and wherein the middle sub-groups of said three sub-groups comprises N/2 strips and the two outer sub-groups, one on either side thereof, each comprise N/4 strips, and the three sub-groups in one track are separated by a distance d and the three sub-groups in the other one of said tracks are separated by a distance $d + \lambda_o/6$, where $\lambda_o$ is the wavelength of the center frequency $f_o$ of the first passband.

8. A filter as claimed in claim 1 wherein each of the three sub-groups have an equal number of conducting strips, and the three sub-groups in one track are separated at a distance d and the three sub-groups in the other one of said tracks are separated by a distance $d + \lambda_o/9$, where $\lambda_o$ is the wavelength of the center frequency $f_o$ of the first passband.

* * * * *